United States Patent
Pugel

(10) Patent No.: US 6,925,291 B2
(45) Date of Patent: Aug. 2, 2005

(54) ELECTRONIC ALIGNMENT SYSTEM FOR A TELEVISION SIGNAL TUNER

(75) Inventor: Michael A. Pugel, Noblesville, IN (US)

(73) Assignee: Thomson Licensing S.A., Boulogne-Billancourt (FR)

( * ) Notice: Subject to any disclaimer, the term of this patent is extended or adjusted under 35 U.S.C. 154(b) by 449 days.

(21) Appl. No.: 10/256,878

(22) Filed: Sep. 27, 2002

(65) Prior Publication Data

US 2004/0063410 A1 Apr. 1, 2004

(51) Int. Cl.⁷ .............................................. H04B 1/18
(52) U.S. Cl. ........................... 455/191.1; 455/192.3; 455/182.3; 331/16; 334/18; 348/731
(58) Field of Search .................. 455/191.1, 191.2, 455/192.1, 192.3, 193.3, 197.2, 197.3, 180.3, 180.4, 182.2, 182.3, 255, 260, 258, 259; 334/17, 18, 48, 58, 59

(56) References Cited

U.S. PATENT DOCUMENTS

| | | | |
|---|---|---|---|
| 4,408,351 A | * 10/1983 | Maurer et al. | 455/260 |
| 4,418,427 A | 11/1983 | Muterspaugh | 455/180 |
| 4,476,583 A | 10/1984 | Muterspaugh | 455/180 |
| 4,481,673 A | 11/1984 | Muterspaugh | 455/180 |
| 4,658,437 A | 4/1987 | Ersoz et al. | 455/180 |
| 4,760,535 A | 7/1988 | Englmeier | |
| 4,918,532 A | * 4/1990 | O'Connor | 348/726 |
| 4,996,599 A | 2/1991 | Anderson | 358/191.1 |
| 5,428,828 A | 6/1995 | Pugel et al. | 455/191.2 |
| 5,678,211 A | 10/1997 | Badger | |
| 5,940,748 A | * 8/1999 | Daughtry et al. | 455/182.2 |
| 6,035,185 A | 3/2000 | Dobrovolny et al. | 455/266 |
| 6,597,408 B1 | * 7/2003 | Oak et al. | 348/731 |
| 2002/0102957 A1 | * 8/2002 | Tseng et al. | 455/257 |

FOREIGN PATENT DOCUMENTS

| | | |
|---|---|---|
| DE | 19904604 A1 | 6/2000 |
| WO | WO 02/27924 A2 | 4/2002 |

* cited by examiner

Primary Examiner—Edward F. Urban
Assistant Examiner—Thuan Nguyen
(74) Attorney, Agent, or Firm—Joseph S. Tripoli; Robert D. Shedd; Brian J. Cromarty

(57) ABSTRACT

An electronic alignment system for a television signal tuner utilizes first and second controllers for generating respective first and second control signals for respective first and second signal processing circuits of a signal processing arrangement, with the first and second signal processing circuits having respective first and second tunable elements responsive to the respective first and second control signals. A deviation range of the first control signal is higher than a deviation range of the second control signal.

19 Claims, 5 Drawing Sheets

US 6,925,291 B2

ELECTRONIC ALIGNMENT SYSTEM FOR A TELEVISION SIGNAL TUNER

BACKGROUND

1. Field of the Invention

The present invention relates to television signal tuners and, more particularly, to an electronic alignment system for a television signal tuner.

2. Background Information

Most, if not all, television signal receivers include a tuner for selecting a particular television signal (channel). Electronic alignment systems for television signal tuners have been developed that utilize a voltage signal based on a selected channel. Essentially, a selected channel to be tuned provides a channel select signal to a tuning voltage controller.

Electronic alignment has heretofore always required that the radio frequency tuning circuitry of the television signal tuner and the local oscillator circuitry of the television signal tuner run on the same voltage controller/supply. Electronic alignment systems, however, utilize high voltage varactor diodes to receive and utilize the high voltage developed by the voltage controller to run both the radio frequency tuning circuitry and the local oscillator circuitry.

It would thus be desirable to have an electronic alignment system for a television signal receiver that utilizes low voltage varactor diodes for at least part of the circuitry.

It would thus be further desirable to have an electronic alignment system that has radio frequency tuning circuitry and local oscillator circuitry that are independently controlled.

SUMMARY

In accordance with the invention, there is provided a tuning arrangement. The tuning arrangement includes means for receiving RF signals, means for outputting a signal, means for processing the RF signals coupled between the means for receiving RF signals and the means for outputting a signal, the means for processing the RF signals including first means for processing the RF signals and second means for processing the RF signals respectively. The first and second means for processing the RF signals include respective first and second means for tuning the RF signals. The tuning arrangement further includes first control means for generating a first control signal coupled to the first means for tuning, and second control means for generating a second control signal coupled to the second means for tuning. A deviation range of the first control means is higher than a deviation signal of the second control means.

BRIEF DESCRIPTION OF THE DRAWINGS

In the drawings.

Corresponding reference characters indicate corresponding parts throughout the several views.

DESCRIPTION OF THE PREFERRED EMBODIMENT(S)

In one form, a tuning arrangement, especially for a television signal tuner, utilizes first and second controllers for generating respective first and second control signals for respective first and second signal processing circuits of a signal processing arrangement, with the first and second signal processing circuits having respective first and second tunable elements responsive to the respective first and second control signals. A deviation range of the first control signal is higher than a deviation range of the second control signal. In one form, the first and second signal processing circuits are responsive to different frequency bands. The first and second controllers may be first and second voltage controllers and, in one form, the first and second voltage controllers may be a tuning controller and a digital to analog converter. The first and second signal processing circuits may be radio frequency tuning circuitry, and local oscillator circuitry for the radio frequency tuning circuitry. The radio frequency circuitry may utilize low voltage varactors as part of the first tunable element that operate over a first voltage range (deviation range) that is supplied by a low voltage digital to analog converter. The local oscillator circuitry may utilize higher voltage varactors as part of the second tunable element that operate over a second voltage range (deviation range) that is higher than the first voltage range and supplied by a phase lock loop.

Figure 1:
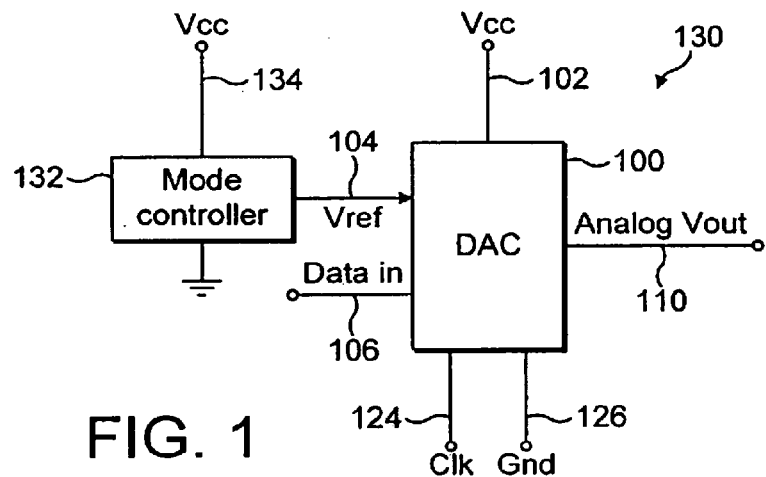
FIG. 1 is a simplified block diagram of a digital to analog converter system in accordance with the principles of the subject invention.

Referring now to the drawings and, more particularly to FIG. 1, there is depicted a simplified block diagram representation of a digital to analog converter system generally designated 130 in accordance with an aspect of the subject invention. The digital to analog converter system 130 includes a digital to analog converter (DAC) 100 and a mode controller 132. The DAC 100 is representative of any type of DAC. The DAC 100 is typically an integrated circuit (IC), however, it is not necessary that the DAC 100 be an IC. Moreover, it should be appreciated that while the mode controller 132 is shown as separate from the DAC 100, the mode controller 132 may be integral with the DAC 100. Therefore, the DAC system 130 may be all part of an IC.

The DAC 100 has a voltage supply input 102 that is operative to receive an operating voltage or voltage supply suitable for allowing the DAC 100 to operate. The voltage of the voltage supply provided to the voltage supply input 102 of the DAC 100 may vary according to the nature of the IC. Typically, however, such voltage is either five (5) or twelve (12) volts. Of course, the DAC 100 (or DAC system 130 if the DAC system 130 is in an integrated IC form) may be different.

The DAC 100 also has a voltage reference input 104 ($V_{ref}$) that is operative to receive a reference voltage ($V_{ref}$). The reference voltage ($V_{ref}$) sets a maximum voltage that the DAC 100 will output. A data input 106 is provided that is operative to receive an N-bit digital word (data). The N-bit digital word is converted into a particular analog voltage.

Each different N-bit digital word provides a different analog voltage. The DAC 100 is configured to accept a set or predetermined N-bit digital word. For example, the DAC 100 may be a three bit digital to analog converter meaning that the DAC 100 accepts only a three (i.e. N=3) bit digital word from 000 to 111. The input data may be input serially in which case there is a single data input 106. Alternatively, the input data may be input in parallel. In the parallel input case there would be a separate line existing for each data bit. For example, a three bit digital to analog converter (accepting a three bits word or data) would have three separate data inputs 106. The number of bits typically determines the resolution of a DAC. Typical resolution may be expressed as $1/(2^N-1)$.

The DAC 100 also has a an analog output 110 that provides an analog output voltage dependent upon the reference voltage (as a maximum) input via the voltage reference input 104 and the input data (N-bit digital word) via the data input 106. The DAC 100 provides an analog output voltage on the analog output 110 which linearly varies from zero to the maximum reference voltage as the digital input word varies from 0 to $2^N-1$. The DAC 100 may also be a multiplying DAC wherein the magnitude of the analog output is also proportional to some analog input. The DAC 100 also has a clock input 124 that is operative to receive a clock signal. The DAC 100 is also connected or coupled to ground via a ground connection 126.

In accordance with an aspect of the subject invention, the mode controller 132 is connected between the voltage reference input 104 and a reference voltage ($V_{cc}$). The mode controller 132 has a reference voltage input 134 that is shown connected to the reference voltage ($V_{cc}$). The mode controller 132 is operative in two states or modes. In one state, the mode controller 132 allows the DAC 100 to operate at a first resolution up to a maximum output voltage corresponding to the reference voltage ($V_{cc}$). In a second state, the mode controller reduces the maximum output voltage (i.e. to a percentage of $V_{cc}$) while increasing the resolution of the DAC 100. The mode controller 132 is also coupled to ground.

Figure 2:
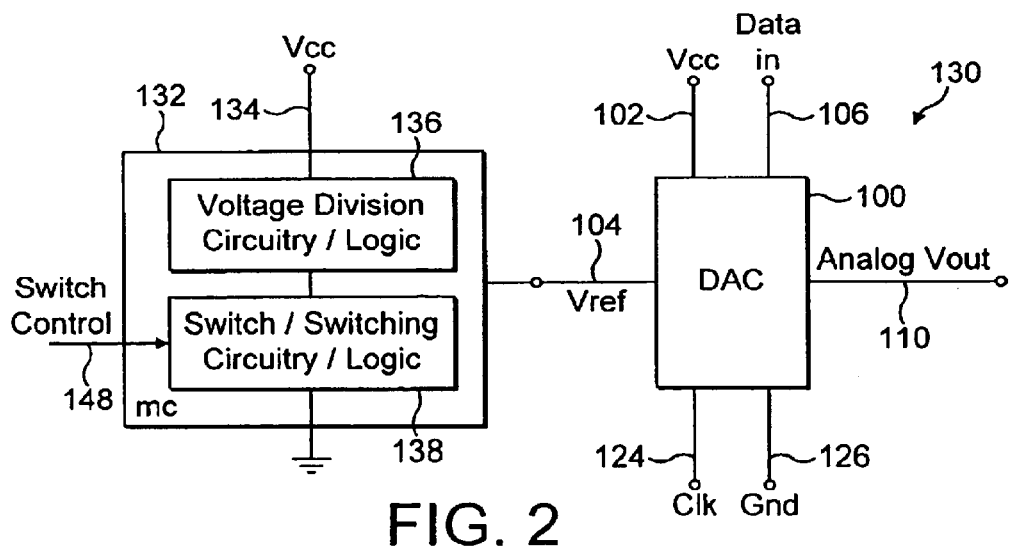
FIG. 2 is a block diagram of the digital to analog converter system of FIG. 1 particularly depicting a block diagram of the mode controller.

Referring now to FIG. 2, there is depicted the DAC system 130 with various elements of the mode controller 132 shown in block form. Particularly, in one form, the mode controller 132 includes voltage division circuitry/logic 136 and switch/switching circuitry/logic 138. The voltage division circuitry/logic 136 is connected to the voltage reference source ($V_{cc}$) via the voltage reference input 134. The switch/switching circuitry/logic 138 is connected to ground and is operative in two states or modes. The first state or mode is an open circuit condition while the second state or mode is a closed circuit condition.

The voltage division circuitry/logic 136 is operative in conjunction with the switch/switching circuitry/logic 138 such that when the switch/switching circuitry/logic 138 is in the first state (open circuit), the voltage division circuitry/logic 136 is operative to provide one hundred percent (100%) of the maximum reference voltage ($V_{cc}$) provided to the reference voltage input 104 as an analog output voltage at the analog voltage output 110 at a first resolution. The voltage division circuitry/logic 136 is further operative in conjunction with the switch/switching circuitry/logic 138 such that when the switch/switching circuitry/logic 138 is in the second state (closed circuit), the voltage division circuitry/logic 136 is operative to provide a percentage of the maximum reference voltage ($V_{cc}$) provided to the reference voltage input 104 as an analog output voltage at the analog voltage output 110 at a second resolution that is greater than the first resolution.

The percentage of the maximum reference voltage ($V_{cc}$) that the voltage division circuitry/logic 136 provides to the DAC 100 (particularly to the voltage reference input $V_{ref}$ 104) is determined by the circuitry of the voltage division circuitry/logic 136. The first resolution is calculated by the following equation:

$$1/(2^N-1),$$

while the second resolution is calculated by the following equation:

$$1/(2^{N+1}-1).$$

From these two equations, it can be seen that the resolution doubles. In fact, the second resolution is actually slightly greater than twice the first resolution depending on the predetermined bit size of the input data word for the DAC 100. For example, if the DAC 100 is a three bit DAC then the first resolution is 1/7 (i.e. there are seven steps from zero to the maximum reference voltage) and thus the second resolution is 1/15 (i.e. there are fifteen steps from zero to the percentage of the maximum reference voltage). As described below, the percentage of the reference voltage (the maximum reference voltage) that is provided as the maximum analog output voltage is determined by circuit element values. This may be termed a control or switchover point. While the present invention will be described with respect to one control point, there may be many control points or there may be a continuously variable control point.

It should be noted that the present DAC system provides a second resolution that is effectively increased. As such, the terms effective, integral and/or fractional resolution may be applied to indicate the increase in resolution. The subject DAC system thus provides an effective increase in resolution over a fractional or percentage range of the DAC, DAC structure, or DAC system. Stated another way, the subject invention is akin to providing half a bit of resolution to the DAC, DAC structure, or DAC system over the entire operating range or one bit of resolution for the percentage or fractional operating range.

Figure 3:
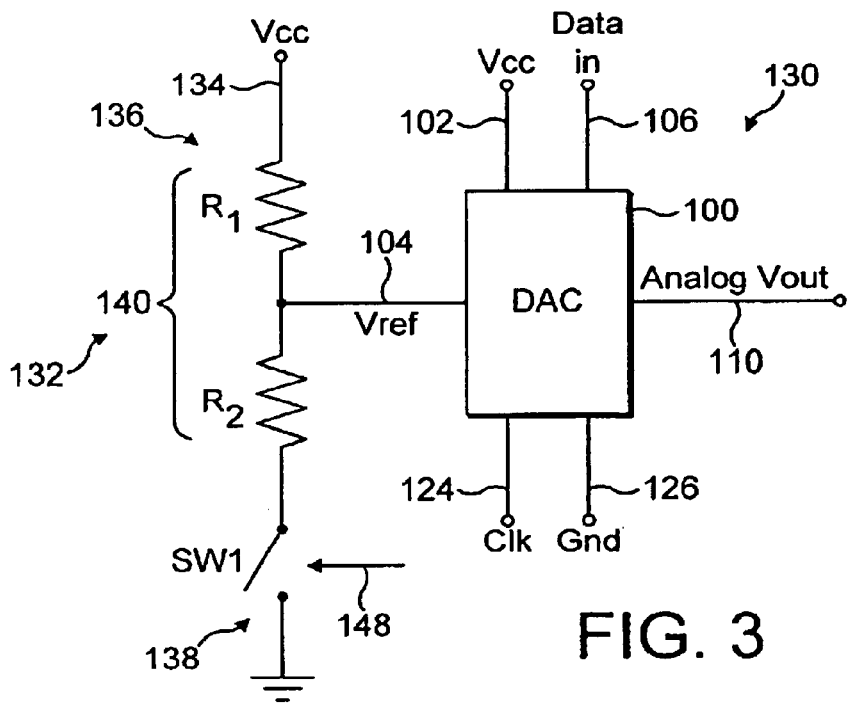
FIG. 3 is a representation of the digital to analog converter system of FIG. 1 depicting a circuit diagram of the mode controller.

Referring to FIG. 3 there is shown an exemplary circuit diagram depiction of the mode controller 132. Particularly, the voltage division circuitry/logic 136 is shown as a voltage divider 140. In an exemplary embodiment, the voltage divider 140 consists of a first resistor R1 and a second resistor R2. The first resistor R1 is coupled to a reference voltage $V_{cc}$. The reference voltage $V_{cc}$ may be ten (10) volts for example. The second resistor R2 is coupled to the switching circuitry 138 here including a switch SW1. The switch SW1 is controlled by a switch control signal provided on a switch control line 148. The switch SW1 is, in turn, connected to ground. The switch control signal opens and closes the switch SW1.

The voltage divider 140 is also connected to the reference voltage $V_{ref}$ input 104 of the DAC 100. Particularly, the reference voltage $V_{ref}$ input 104 of the DAC 100 is connected between the first resistor R1 and the second resistor R2. In operation, when the switch SW1 is in an open position (open circuit) as shown in FIG. 3, the voltage provided to the reference voltage $V_{ref}$ input 104 of the DAC 100 is the voltage across the first resistor R1. The voltage across the first resistor R1 is the reference voltage supply $V_{cc}$ such that the reference voltage $V_{ref}$ equals $V_{cc}$. When the switch SW1 is in a closed position (closed circuit), the voltage provided to the reference voltage $V_{ref}$ input 104 of the DAC 100 is the voltage divided across the first resistor R1 and the second resistor R2 as provided by the following equation:

$$R1/(R1+R2).$$

The reference voltage thus supplied to the DAC 100 is dependent upon the values of the resistors R1 and R2. Thus, the maximum analog output voltage is dependent upon the values of R1 and R2 when the switch SW1 is closed.

When R1=R2, the term R1+R2 may be changed to R1+R1 which is 2R1. Therefore, the equation R1/(R1+R2) may be rewritten as R1/2R1 which simplifies to ½R1. Thus when R1=R2, the maximum reference voltage or control point provided to the DAC 100 (and the maximum analog output voltage) is ½ or 50% of the reference voltage supply $V_{cc}$. As a generality, when R1<R2, the control point is less than (<)½$V_{cc}$ or 50% $V_{cc}$. When R1>R2, the control point is greater than (>) ½$V_{cc}$ or 50% $V_{cc}$.

Resistors R1 and R2 are typically both fixed in value (ohms) but may be both variable or one fixed and one variable as desired. In this manner the control point or reference voltage provided to the DAC 100 may be controlled rather than fixed in the case of fixed values of resistor R1 and resistor R2. Thus, the maximum reference voltage provided to the DAC 100 may be from just over zero to 100% of the reference voltage supply.

Figure 4:
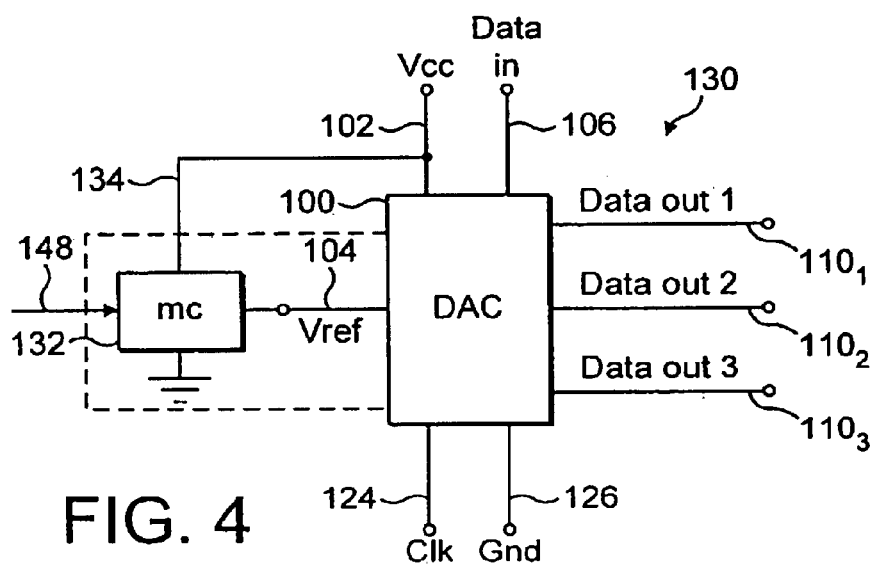
FIG. 4 is an alternative embodiment of a digital to analog converter system.

Referring to FIG. 4, there is depicted an alternative embodiment a digital to analog converter (DAC) system generally designated 150. In this embodiment, the mode controller 132 is shown as possibly integrated with the DAC 100 by the dashed lines. It should be appreciated, however, that the mode controller 132 may or may not be integrated with the DAC 100. The DAC system 150 operates in the same manner as the DAC system 130 described above with the exception that the DAC 100 has a first data out 1 analog voltage output 110₁, a second data out 2 analog voltage output 110₂, and a third data out 3 analog voltage output 110₃. Each analog voltage output 110₁, 110₂, and 110₃ provides a separate but equal analog voltage output for the digital input word. Additionally, the DAC system 150 utilizes the voltage $V_{cc}$ for the reference voltage and the operating voltage for the DAC 100.

Figure 5:
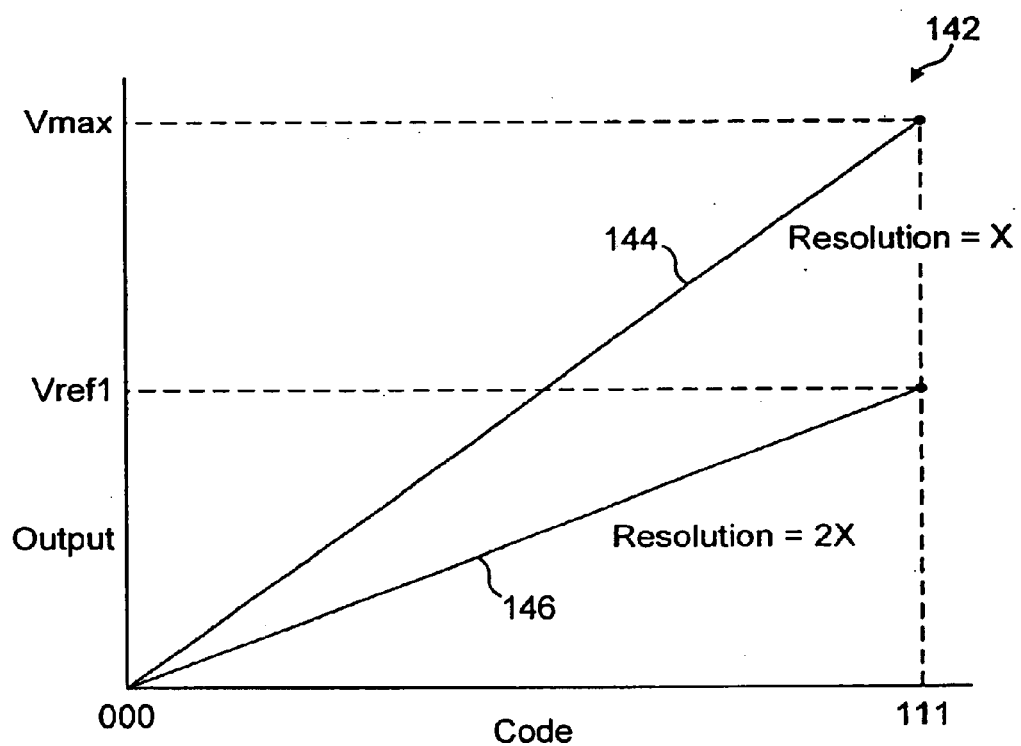
FIG. 5 is a graph of output voltage versus input code for a three bit digital to analog converter with and without a mode controller.

FIG. 5 provides a graph 142 of the subject DAC system with a three bit DAC showing output voltage as a function of the three bit digital input data. The output voltage ranges from a minimum of zero (0) volts to a maximum of $V_{max}$ wherein $V_{max}$ may be any voltage but corresponds to the reference voltage provided to the mode controller 132 as the digital input word varies from 000 to 111. $V_{max}$ also corresponds to the reference voltage provided to the DAC 100 when the switch SW1 is in an open state. In the graph 142, the voltage $V_{ref1}$ corresponds to the control point or percentage of maximum reference voltage when the switch SW1 is closed and the voltage divider 140 is functioning.

In the example depicted in the graph 142, the line 144 represents the analog output voltage when the switch SW1 is in an open position. For the digital input word 000, the analog voltage output is 0 volts. As the digital input word progresses to 111, the analog output voltage increases to a maximum of $V_{max}$ (i.e. 100% of the reference voltage). The resolution of line 144 may be denoted "X".

The line 146 represents the analog output voltage when the switch SW1 is in a closed position. For the digital input word 000, the analog voltage output is 0 volts. As the digital input word progresses to 111, the analog output voltage increases to a maximum of $V_{ref1}$ (i.e. a percentage of the reference voltage in accordance with the equation R1/(R1+R2)). The resolution of line 144 may be denoted "2X". It can be seen that the slope of the line 146 is less than the slope of the line 144 indicating that there are less voltage increments per step or digital input word (resolution) between 0 volts and the maximum analog output voltage $V_{ref1}$ than the voltage increments per step or digital input word (resolution) from 0 volts and the maximum analog output voltage $V_{max}$.

The subject DAC system thus provides switched resolution of an N-bit DAC. Particularly, the subject DAC system allows one to realize the resolution of N+1 bits over a percentage voltage range of a DAC while either utilizing an existing N-bit DAC or providing a DAC structure for N bits. Using the three bit example, an R2R ladder network DAC provides (acts like) eight (8) discrete ladder points including endpoints. If a 4 bit resolution DAC is needed, the number of ladder points would need to be sixteen (16). With the subject invention, a 3 bit DAC structure may be used to realize 4 bit performance for a particular or given range.

Figure 6:
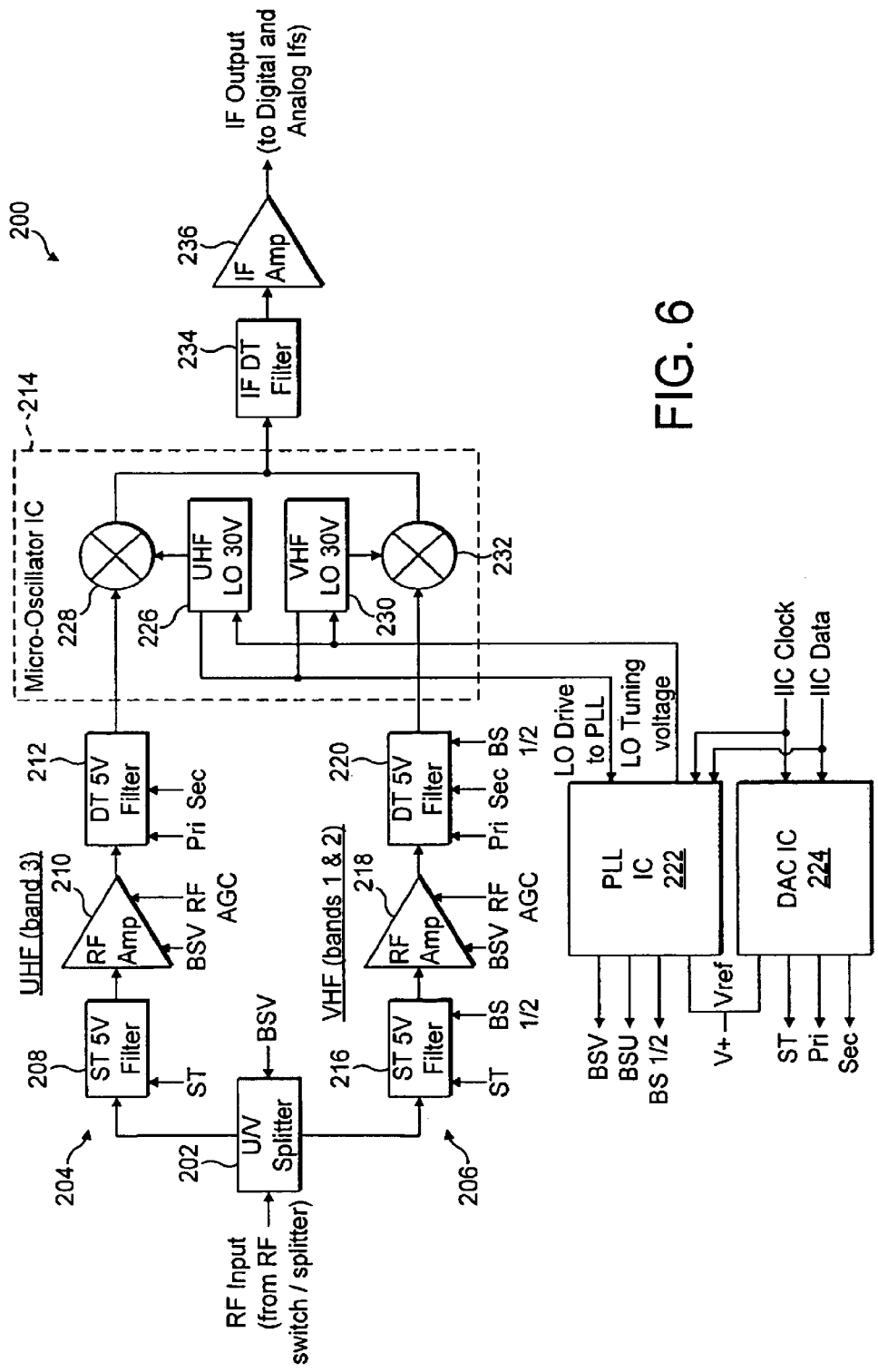
FIG. 6 is a block diagram of an electronic alignment system for a television signal tuner in which the digital to analog converter system may be used.

Referring now to FIG. 6, there is depicted a block diagram of an exemplary electronic alignment system for a television signal receiver (television signal) tuner generally designated 200 in which the DAC system described above may be used. It should be understood, however, that it is not necessary that the DAC system described herein be used in the electronic alignment system 200. The electronic alignment system 200 is operative to receive radio frequency (RF) television signals (RF signals or input) from an RF television signal source and provide an intermediate frequency (IF) output. Particularly, the electronic alignment system 200 is operative to receive several bands of RF television signals such as VHF (more particularly, two VHF band, band 1 and band 2) and UHF television signals and, according to a selected television channel, provide an IF television channel signal.

The RF signals are received from an RF signal source such as cable television, an antenna, or the like that may be provided through an RF input switch or splitter. The received RF signals are input to a U/V (UHF/VHF) splitter 202 that is operative to separate the UHF band from the VHF bands. The U/V splitter 202 receives a control signal BSV (band select VHF) when the selected channel is a VHF band television signal. The control signal BSV is generated by a phase lock loop (PLL) 222 here shown in the form of a PLL IC. The control signal BSV is a voltage generated by the PLL 222 in response to a channel selection signal.

The electronic alignment system 200 has a UHF processing portion 204, a VHF processing portion 206, a mixer/oscillator portion 214, the PLL 222, and a digital to analog converter (DAC) 224. The UHF processing portion 204 is operative to tune a particular UHF channel (particular television signal) in response to channel selection. The VHF processing portion 206 is operative to tune a particular VHF channel (particular television signal) within a particular VHF band (here one of two VHF bands) in response to channel selection.

The UHF processing portion 204 includes a single tuned (ST) filter 208 that is connected to the U/V splitter 202 so as to receive the output of the U/V splitter 202. Particularly, the UHF signals are received by the single tuned filter 208 from the U/V splitter 202. In accordance with an aspect of the subject invention, the single tuned filter 208 operates over a zero to five (0–5) volt range. Particularly, the single tuned filter 208 operates over a continuous analog voltage from zero to five (0–5) volts. A zero to five volt signal, designated ST, is received from the DAC 224. The DAC 224 produces the zero to five volt signal (i.e. the continuous analog 0–5 volt signal) ST in response to the channel selection signal. The voltage signal ST allows the single tuned filter 208 to tune the selected channel.

The output of the single tuned filter 208 is provided to an RF amplifier (amp) 210. The RF amplifier 210 is operative to amplify the RF UHF signal from the single tuned filter 208 according to an RF AGC (automatic gain control) signal produced by the television signal receiver. The RF amplifier 210 is also operative to receive a UHF band select signal (BSU) generated by and from the PLL 222. The UHF band select signal BSU is generated by the PLL in response to the channel selection signal. The band select signal BSU is essentially an on/off signal for the RF amplifier 210.

The output of the RF amplifier 210 is provided to a double tuned (DT) filter 212. In accordance with an aspect of the subject invention, the double tuned filter 212 operates over a zero to five (0–5) volt range. Particularly, the double tuned filter 212 operates over a continuous analog voltage from zero to five (0–5) volts. A zero to five volt signal, designated PRI, is received from the DAC 224. The DAC 224 produces the zero to five volt signal (i.e. the continuous analog 0–5 volt signal) PRI in response to the channel selection signal. The PRI voltage signal allows the first portion of the double tuned filter 212 to tune the selected channel. A zero to five volt signal, designated SEC, is also received from the DAC 224. The DAC 224 produces the zero to five volt signal (i.e. the continuous analog 0–5 volt signal) SEC in response to the channel selection signal. The SEC voltage signal allows the second portion of the double tuned filter 212 to tune the selected channel.

The output of the double tuned filter 212 is provided to the mixer/oscillator 214, shown in the form of an IC. It should be appreciated that the mixer portion and the oscillator portion may be separate, but is shown combined. In particular, the output of the double tuned filter 212 is provided to a mixer 228. A UHF local oscillator (LO) 226 has an output connected to the mixer 228. The UHF LO 226 is operative to receive a local oscillator (LO) tuning voltage signal from the PLL 222 and generate a tuned local oscillator signal. The LO tuning voltage signal is produced by the PLL in response to the channel selection signal. The LO tuning voltage signal is an analog voltage signal from zero to thirty (0–30) volts. The UHF LO 226 also provides feedback to the PLL 222 in the form of an LO drive signal.

The UHF mixer 228 combines or mixes the tuned UHF local oscillator signal from the UHF LO 226 with the output signal (selected channel) of the double tuned filter 212. The output of the mixer 228 is provided to a double tuned intermediate frequency (IF) filter 234. The double tuned IF filter 234 provides its output to an IF amplifier (amp) 236. The amplified IF signal (selected television channel) from the IF amplifier 236 is then provided as IF output to the various digital and analog IF components (not shown) of the television signal receiver or other component.

The VHF processing portion 206 includes a single tuned (ST) filter 216 that is connected to the U/V splitter 202 so as to receive the output of the U/V splitter 202. Particularly, the VHF signals are received by the single tuned filter 216 from the U/V splitter 202. In accordance with an aspect of the subject invention, the single tuned filter 216 operates over a zero to five (0–5) volt range. Particularly, the single tuned filter 216 operates over a continuous analog voltage from zero to five (0–5) volts. A zero to five volt signal, designated ST, is received from the DAC 224. The DAC 224 produces the zero to five volt signal (i.e. the continuous analog 0–5 volt signal) ST in response to the channel selection signal. The voltage signal ST allows the single tuned filter 216 to tune the selected channel.

Additionally, the single tuned filter 216 is operative to receive a band select signal (BS 1/2) produced by and therefore from the PLL 222. The band select signal (BS 1/2) selects one of two VHF bands. Particularly, band select signal (BS 1/2) is an on/off voltage signal derived from the channel selection signal.

The output of the single tuned filter 216 is provided to an RF amplifier (amp) 218. The RF amplifier 218 is operative to amplify the RF VHF signal from the single tuned filter 216 according to an RF AGC (automatic gain control) signal produced by the television signal receiver. The RF amplifier 218 is also operative to receive a VHF band select signal (BSV) generated by and from the PLL 222. The VHF band select signal BSV is generated by the PLL in response to the channel selection signal. The band select signal BSV is essentially an on/off signal for the RF amplifier 218.

The output of the RF amplifier 218 is provided to a double tuned (DT) filter 220. In accordance with an aspect of the subject invention, the double tuned filter 220 operates over a zero to five (0–5) volt range. Particularly, the double tuned filter 220 operates over a continuous analog voltage from zero to five (0–5) volts. A zero to five volt signal, designated PRI, is received from the DAC 224. The DAC 224 produces the zero to five volt signal (i.e. the continuous analog 0–5 volt signal) PRI in response to the channel selection signal. The PRI voltage signal allows the first portion of the double tuned filter 220 to tune the selected channel. A zero to five volt signal, designated SEC, is also received from the DAC 224. The DAC 224 produces the zero to five volt signal (i.e. the continuous analog 0–5 volt signal) SEC in response to the channel selection signal. The SEC voltage signal allows the second portion of the double tuned filter 220 to tune the selected channel.

Additionally, the double tuned filter 220 is operative to receive the band select signal (BS 1/2) produced by and therefore from the PLL 222. The band select signal (BS 1/2) selects one of two VHF bands. Particularly, band select signal (BS 1/2) is an on/off voltage signal derived from the channel selection signal. The band select signal (BS 1/2) is the same as provided to the single tuned filter 216.

The output of the double tuned filter 220 is provided to the mixer/oscillator 214, shown in the form of an IC. It should be appreciated that the mixer portion and the oscillator portion may be separate, but is shown combined. In particular, the output of the double tuned filter 220 is provided to a mixer 232. A VHF local oscillator (LO) 230 has an output connected to the mixer 232. The VHF LO 230 is operative to receive a local oscillator (LO) tuning voltage signal from the PLL 222 and generate a tuned local oscillator signal. The LO tuning voltage signal is produced by the PLL in response to the channel selection signal. The LO tuning voltage signal is an analog voltage signal from zero to thirty (0–30) volts. The VHF LO 230 also provides feedback to the PLL 222 in the form of an LO drive signal.

The VHF mixer 232 combines or mixes the tuned VHF local oscillator signal from the VHF LO 230 with the output signal (selected channel) of the double tuned filter 220. The output of the mixer 232 is provided to the double tuned intermediate frequency (IF) filter 234. The double tuned IF filter 234 provides its output to the IF amplifier (amp) 236. The amplified IF signal (selected television channel) from the IF amplifier 236 is then provided as IF output to the various digital and analog IF components (not shown) of the television signal receiver or other component.

The channel selection signal is typically, but not necessarily, produced by the television signal receiver having the electronic alignment system 200 in response to user input. The channel selection signal is provided to the DAC 224 and the PLL 222. While other manners of providing the channel selection signal are contemplated, the electronic alignment system 200 is shown utilizing the I²C (or IIC) configuration/protocol. As such, an I²C clock line and an I²C data line is shown connected to the DAC 224 and the PLL 222. Both the PLL 222 and the DAC 224 produce an analog voltage signal continuously ranging from zero (0) to a maximum voltage which, in the case of the DAC 224 is five (5) volts, and in the case of the PLL 222 is thirty (30) volts.

Moreover, it should be noted that while the electronic alignment system or electronic tuner presented herein is described using five volt varactors for the RF (radio frequency) section and thirty volt varactors for the LO (local oscillator) section, other voltage varactors may be used. According to the principles of the subject invention, the voltage supply (and thus the varactor(s)) for the RF section and the voltage supply (and thus the varactor(s)) for the LO section are just different. Such difference preferably manifests itself as the voltage supply and the varactor(s) (i.e. varactor voltage capacity) for the RF section as lower than the voltage supply and the varactor(s) (i.e. varactor voltage capacity) for the LO section. Thus, for example, the RF section may use a twelve volt supply/varactor(s) while the LO section may use a thirty-three volt supply/varactor(s). Further, the supply and/or varactor voltage may or may not be a function of one another.

Figure 7:
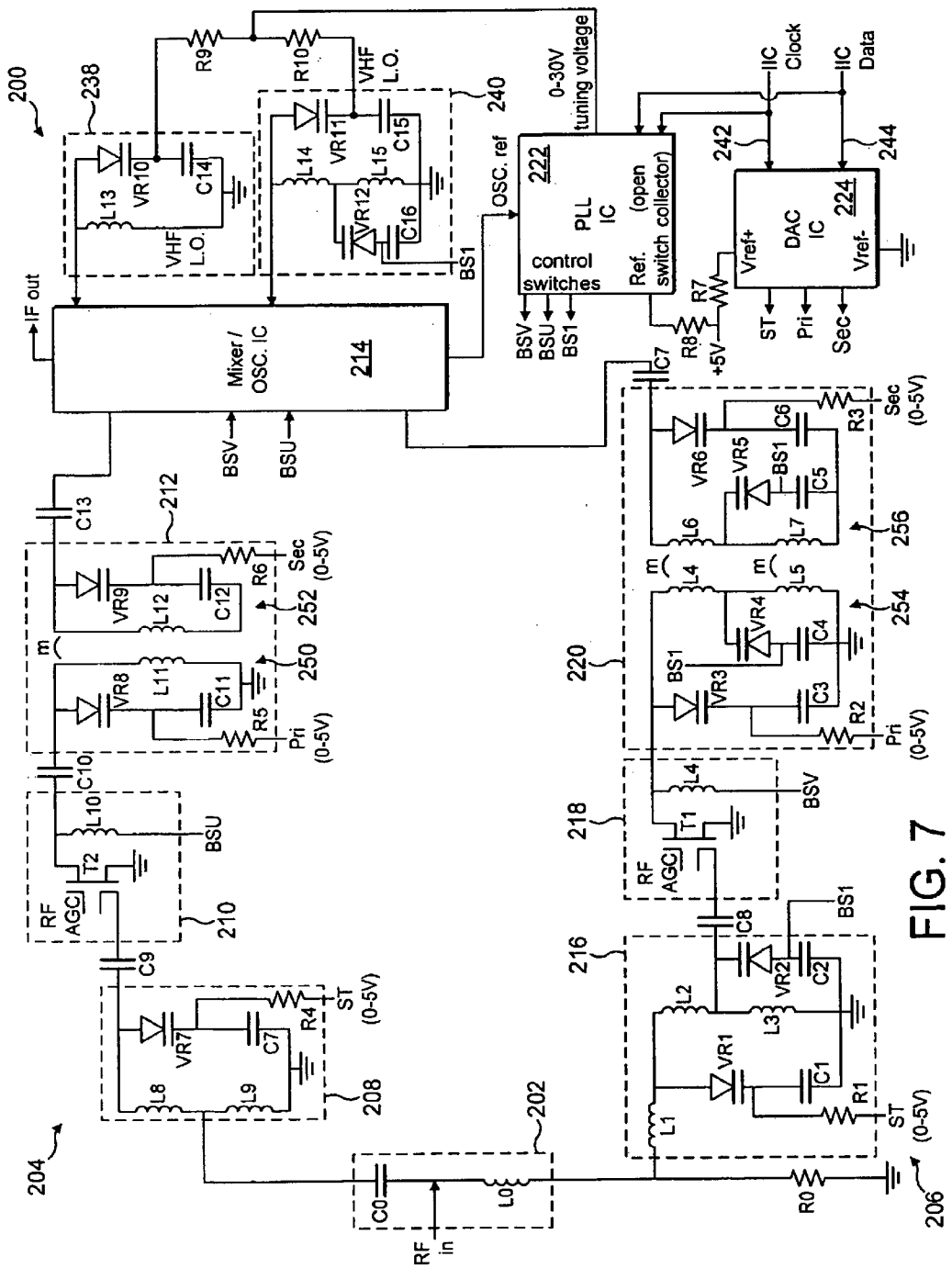
FIG. 7 is an exemplary circuit diagram of the electronic alignment system of FIG. 6.

Referring to FIG. 7, there is depicted an exemplary circuit diagram for the block diagram for the electronic alignment system 200 of FIG. 6. It should be appreciated that the circuit of FIG. 7 works in the manner described with respect to FIG. 6. Therefore, only certain portions of the circuit 200 will be described with particularity. Initially, the RF IN is split by the splitter 202, particularly by the capacitor C0 and the inductor L0. The UHF portion branches through the capacitor C0 while the VHF portion branches through the inductor L0. The resistor R0 provides charge buildup protection/elimination and/or lightening protection. The resistor R0 is coupled to the inductor L0 and ground.

As indicated above, the UHF section 204 has a single tuned filter 208 that is varactor voltage controlled. The single tuned filter 208 includes series inductors L8 and L9 that is in parallel with a low voltage (i.e. 0–5 volts) varactor (varactor diode) VR7 and a capacitor C7. The series inductors L8 and L9 and parallel varactor VR7 and capacitor C7 are connected to ground. The tuning voltage signal ST is provided through a resistor R4 to the node between the varactor VR7 and the capacitor C7. The single tuned filter 208 changes in electrical characteristics based on the voltage applied to the varactor VR7. In this manner, the single tuned filter 208 may tune a particular UHF channel based on the input voltage signal ST.

The single tuned filter 208 is coupled to the RF amplifier 210 via a capacitor C9. The amplifier 210 includes a dual gate N channel metal oxide semiconductor (MOS) field effect transistor (FET) T2. The capacitor C9 is coupled to one gate of the transistor T2, while the other gate of the transistor T2 receives the RF AGC signal. The source of the transistor T2 is connected to ground. An inductor L10 is coupled to the drain of the transistor T2. The inductor L10 is coupled to the PLL 222 in order to receive the UHF band select (BSU) signal when appropriate. Application or non-application of the BSU signal causes the amplifier to either work or not resulting in conduction to let the signal through or non-conduction to not let the signal through. The RF amplifier 210 is coupled to the double tuned filter 212 via a capacitor C10.

The double tuned filter 212 includes a first stage 250 that is in mutual conductance relationship with a second stage 252 via respective inductors L11 and L12. The first stage 250 includes a low voltage (0–5 volts) varactor VR8 that is coupled at one end to the capacitor C10 and at the other end to a capacitor C11 such that the varactor VR8 and the capacitor C11 are in series. The series varactor VR8 and capacitor C11 are in parallel with the inductor L11. The tuning voltage signal PRI is provided through a resistor R5 to the node between the varactor VR8 and the capacitor C11. The first stage 250 changes in electrical characteristics based on the voltage applied to the varactor VR8.

The double tuned filter 212 includes a second stage 252 that is in mutual conductance relationship with the first stage 250 via the respective inductors L11 and L12. The second stage 252 includes a low voltage (0–5 volts) varactor VR9 that is coupled at one end to the inductor L12 and at the other end to a capacitor C12 such that the varactor VR9 and the capacitor C12 are in series while the varactor VR9 and the capacitor C12 are in parallel with the inductor L12. The tuning voltage signal SEC is provided through a resistor R5 to the node between the varactor VR9 and the capacitor C12. The second stage 252 changes in electrical characteristics based on the voltage applied to the varactor VR9. In this manner, the double tuned filter 212 may tune a particular UHF channel based on the input voltage signals PRI and SEC. The output of the double tuned filter 212 is provided through a capacitor C13 to the mixer/oscillator IC 214.

As indicated above, the VHF section 206 has a single tuned filter 216 that is varactor voltage controlled. The single tuned filter 216 includes an inductor L1. A low voltage (i.e. 0–5 volts) varactor (varactor diode) VR1 is coupled at one end to the inductor L1 and at the other end to a capacitor C1 such that the varactor VR1 and the capacitor C1 are in series. The series varactor VR1 and the capacitor C1 are in parallel with series inductors L2 and L3. The capacitor C1 and the inductor L3 are connected to ground. The tuning voltage signal ST is provided through a resistor R4 to the node between the varactor VR1 and the capacitor C1. The single tuned filter 216 changes in electrical characteristics based on the voltage applied to the varactor VR1. In this manner, the single tuned filter 216 may tune a particular VHF channel based on the input voltage signal ST.

The single tuned filter 216 is further responsive to the band select signal BS1 in order to change the band tuning of the single tuned filter 216. The single tuned filter 216 further includes a low voltage (0–5 volts) varactor VR2 in series with a capacitor C2. The signal BS1 is applied between the varactor VR2 and the capacitor C2. The series varactor VR2 and capacitor C2 are disposed in parallel with the inductor L3.

The single tuned filter 216 is coupled to the RF amplifier 218 via a capacitor C8. The amplifier 218 includes a dual gate N channel metal oxide semiconductor (MOS) field effect transistor (FET) T1. The capacitor C8 is coupled to one gate of the transistor T1, while the other gate of the transistor T1 receives the RF AGC signal. The source of the transistor T1 is connected to ground. An inductor L4 is coupled to the drain of the transistor T1. The inductor L4 is coupled to the PLL 222 in order to receive the VHF band select (BSV) signal when appropriate. Application or non-application of the BSV signal causes the amplifier to either work or not resulting in conduction to let the signal through or non-conduction to not let the signal through. The RF amplifier 218 is coupled to the double tuned filter 220.

The double tuned filter 220 includes a first stage 254 that is in mutual conductance relationship with a second stage 256 via two sets of respective inductors L4 and L6, and L5 and L7. The first stage 254 includes a low voltage (0–5 volts) varactor VR3 that is coupled at one end to the amplifier 218 and at the other end to a capacitor C3 such that the varactor VR3 and the capacitor C3 are in series. The series varactor VR3 and capacitor C3 are in parallel with the series inductors L4 and L5. The tuning voltage signal PRI is provided through a resistor R2 to the node between the varactor VR3 and the capacitor C3. The first stage 254 changes in electrical characteristics based on the voltage applied to the varactor VR3.

The first stage 254 of the double tuned filter 220 is further responsive to the band select signal BS1 in order to change the band tuning of the first stage 254 of the double tuned filter 220. The first stage 254 further includes a low voltage (0–5 volts) varactor VR4 in series with a capacitor C4. The signal BS1 is applied between the varactor VR2 and the capacitor C2. The series varactor VR2 and capacitor C4 is disposed in parallel with the inductor L5.

The double tuned filter 220 includes a second stage 256 that is in mutual conductance relationship with the first stage 254 via the respective inductor pairs L4 and L6, and L5 and L7. The second stage 256 includes a low voltage (0–5 volts) varactor VR6 that is coupled at one end to the inductor L6 and at the other end to a capacitor C6 such that the varactor VR6 and the capacitor C6 are in series while the varactor VR3 and the capacitor C6 are in parallel with the inductors L6 and L7. The tuning voltage signal SEC is provided through a resistor R3 to the node between the varactor VR6 and the capacitor C6. The second stage 256 changes in electrical characteristics based on the voltage applied to the varactor VR6.

The second stage 256 of the double tuned filter 220 is further responsive to the band select signal BS1 in order to change the band tuning of the second stage 256 of the double tuned filter 220. The second stage 256 further includes a low voltage (0–5 volts) varactor VR5 in series with a capacitor C5. The signal BS1 is applied between the varactor VR5 and the capacitor C5. The series varactor VR5 and capacitor C5 is disposed in parallel with the inductor L7. In this manner, the double tuned filter 220 may tune a particular VHF channel of a particular band based on the input voltage signals PRI and SEC and the band select signal BS1. The output of the double tuned filter 220 is provided through a capacitor C7 to the mixer/oscillator IC 214.

The mixer/oscillator 214 receives either the BSV or BSU control signals in order to select which local oscillator to utilize. Further, the PLL 222 is coupled to the mixer oscillator 214 such that a tuning voltage derived from the channel selection signal, is provided to a UHF local oscillator (LO) tuning section 238 and a VHF local oscillator (LO) tuning section 240. The UHF LO tuning section 238 is operative to provide tuning based on the channel selection. The VHF LO tuning section 240 is operative to provide tuning based on the channel selection.

The UHF LO tuning section 238 includes a high voltage (0–30 volts) varactor VR10 that is in series with a capacitor C14. The series varactor VR10 and capacitor C14 are disposed in parallel with an inductor L13. The 0–30 volt tuning signal from the PLL 222 is provided through a resistor R9 to the node between the varactor VR1 and the capacitor C14. This provides a tuned signal to the mixer/oscillator 214 for UHF tuning.

The VHF LO tuning section 240 includes a high voltage (0–30 volts) varactor VR11 that is in series with a capacitor C15. The series varactor VR11 and capacitor C15 are disposed in parallel with an inductor pair L14 and L15. The 0–30 volt tuning signal from the PLL 222 is provided through a resistor R10 to the node between the varactor VR11 and the capacitor C15. Tapped between the inductor pair L14 and L15 is band select circuitry operative in response to the band select signal BS1. The band select signal is provided between a varactor VR12 and a capacitor C16. This provides a tuned signal to the mixer/oscillator 214 for VHF tuning.

As indicated herein, the subject DAC system described above is preferably used in the exemplary electronic alignment system for a television signal receiver (television signal) tuner due to the tuning characteristics of varactor diodes (varactors). Particularly, the tuning characteristics of a varactor diode is such that it has a more rapid change of capacitance (and frequency) in the lower voltage range. As a result, this more rapid change sets the necessary resolution (i.e. a greater resolution). In the upper voltage range, however, the change is much slower, allowing for a lower resolution. While a higher resolution DAC (i.e. more bits) may be used, a higher resolution DAC is more expensive. Moreover, a higher resolution DAC would then waste the resolution at the higher voltages (and frequencies within a tuning band). The present switched resolution DAC thus allows one to use the lower resolution DAC and gain the advantage of the higher resolution only in the needed range.

While this invention has been described as having a preferred design, the present invention can be further modified within the spirit and scope of this disclosure. This application is therefore intended to cover any variations, uses, of adaptations of the invention using its general principles. Further, this application is intended to cover such departures from the present disclosure as come within known or customary practice in the art to which this invention pertains and which fall within the limits of the appended claims.

What is claimed is:

1. A tuning arrangement comprising:
   a source of RF signals;
   a signal output point;
   a signal processing arrangement coupled between said source of RF signals and said signal output point, said signal processing arrangement including first and second signal processing circuits respectively;
   said first and second signal processing circuits including respective first and second tunable elements;
   a first controller coupled to said first tunable element for generating a first control signal;
   a second controller coupled to said second tunable element for generating a second control signal; and
   a deviation range of said first control signal is higher than a deviation signal of said second control signal.

2. The tuning arrangement of claim 1, wherein said second signal processing circuit comprises first frequency band signal processing circuitry and second frequency band processing circuitry.

3. The tuning arrangement of claim 1, wherein said first signal processing circuit comprises oscillator circuitry, and said second signal processing circuit comprises RF tuning circuitry.

4. The tuning arrangement of claim 1, wherein said first controller comprises a phase lock loop and said second controller comprises a digital to analog converter.

5. The tuning arrangement of claim 1, wherein said first tunable element comprises first and second local oscillator circuits responsive to said first control signal, and said second tunable element comprises first and second tunable filter elements responsive to said second control signal.

6. The tuning arrangement of claim 5, wherein said first tunable filter elements comprises a first single tuned tunable filter and a first double tuned tunable filter responsive to said deviation range of said second control signal to pass a selected frequency, and said second tunable filter elements comprises a second single tuned tunable filter and a second double tuned tunable filter responsive to said deviation range of said second control signal to pass a selected frequency.

7. The tuning arrangement of claim 6, wherein said first and second single tuned tunable filters each includes a varactor responsive to said deviation range of said second control signal, and said first and second double tuned tunable filters each includes two varactors each of which is separately responsive to said deviation range of said second control signal.

8. A tuning arrangement comprising:

means for receiving RF signals;

means for outputting a signal;

means for processing the RF signals coupled between said means for receiving RF signals and said means for outputting a signal, said means for processing the RF signals including first RF signal processing means for processing the RF signals and second RF signal processing means for processing the RF signals respectively;

said first RF signal processing means including first means for tuning the RF signals;

said second RF signal processing means including second means for tuning the RF signals;

first control means for generating a first control signal coupled to said first means for tuning;

second control means for generating a second control signal coupled to said second means for tuning; and wherein a deviation range of said second control means is higher than a deviation signal of said first control means.

9. The tuning arrangement of claim 8, wherein said first RF signal processing means for processing the RF signals comprises means for processing a first frequency band signal and means for processing a second frequency band signal.

10. The tuning arrangement of claim 8, wherein said second means for processing the RF signals comprises mixing means.

11. The tuning arrangement of claim 8, wherein said second control means comprises a phase lock loop means and said first control means comprises a digital to analog converter.

12. The tuning arrangement of claim 8, wherein said second means for tuning comprises first and second means for generating a local oscillator signal responsive to said second control signal, and said first means for tuning comprises first and second means for tunably filtering the RF signals.

13. The tuning arrangement of claim 12, wherein said first means for tunably filtering the RF signals comprises a first single tuned tunable filter means and a first double tuned tunable filter means responsive to said deviation range of said first control signal to pass a selected frequency, and said second means for tunably filtering the RF signals comprises a first single tuned filter means and a second double tuned tunable filter means responsive to said deviation range of said first control signal to pass a selected frequency.

14. The tuning arrangement of claim 13, wherein said first and second single tuned tunable filter means each includes a varactor responsive to said deviation range of said first control signal, and said first and second double tuned tunable filter means each includes two varactors each of which is separately responsive to said deviation range of said first control signal.

15. In a television signal receiver, a method of tuning comprising:

receiving a plurality of RF signals;

generating by a first controller a first control signal having a first deviation range;

tuning the plurality of RF signals according to said first control signal to obtain a selected one of said RF signals;

generating by a second controller a second control signal having a second deviation range that is higher than the first deviation range;

generating a local oscillator signal according to the second control signal; and mixing said local oscillator signal with said selected one of said RF signals to generate an IF signal.

16. The method of claim 15, wherein the step of generating by a first controller a first control signal having a first deviation range includes the step of generating by a first controller comprising a digital to analog converter a first control signal having a first deviation range.

17. The method of claim 15, wherein the step of generating by a second controller a second control signal having a second deviation range includes the step of generating by a second controller comprising a phase lock loop a second control signal having a second deviation range.

18. The method of claim 15, wherein the step of tuning the plurality of RF signals according to said first control signal includes the step of selecting via one of first and second single tuned tunable filter and double tuned tunable filter pairs one of said RF signals according to said first control signal.

19. The method of claim 18, wherein the step of selecting via one of first and second single tuned tunable filter and double tuned tunable filter pairs one of said RF signals according to said first control signal includes the step of selecting via one of first and second single tuned tunable filter via a varactor diode and double tuned tunable filter via dual varactor diodes pairs one of said RF signals according to said first control signal.

* * * * *